United States Patent [19]

Suzuki et al.

[11] 4,298,419

[45] Nov. 3, 1981

[54] DRY ETCHING APPARATUS

[75] Inventors: Keizo Suzuki; Sadayuki Okudaira; Shigeru Nishimatsu, all of Kokubunji; Ichiro Kanomata, Fuchu, all of Japan

[73] Assignee: Hitachi, Ltd., Tokyo, Japan

[21] Appl. No.: 163,294

[22] Filed: Jun. 26, 1980

[30] Foreign Application Priority Data

Jul. 13, 1979 [JP] Japan .................................. 54/88115

[51] Int. Cl.³ .................... C23F 1/02; H01L 21/306; C03C 15/00; C03C 25/06
[52] U.S. Cl. .................................. 156/345; 156/643; 156/646; 156/657; 204/192 E; 204/298; 250/531
[58] Field of Search ............... 156/345, 643, 646, 657; 204/164, 192 E, 298; 250/531; 219/121 P; 427/723

[56] References Cited

U.S. PATENT DOCUMENTS 4,101,411  7/1978  Suzuki et al. ..................... 204/298
4,253,907  3/1981  Parry ................................. 156/643

Primary Examiner—William A. Powell
Attorney, Agent, or Firm—Craig and Antonelli

[57] ABSTRACT

A dry etching apparatus using microwaves according to the present invention is equipped with means for impressing such an AC voltage upon a sample as has a frequency ranging from 100 KHx to 10 MHx. Consequently, the sample has its surface prevented from being charged up no matter which it might be made of an insulator or might have its surface covered with an insulator. As a result, the etching rate can be maintained at a high level even for such sample.

4 Claims, 4 Drawing Figures

DRY ETCHING APPARATUS

BACKGROUND OF THE INVNETION

1. Field of the Invention

The present invention relates to an equipment to manufacture solid surfaces with ion-using technology, and more particularly to improvements in an apparatus for etching the solid surfaces with ions in plasma.

2. Description of the Prior Art

In a semiconductor field or in a field requiring for the etching technique as fine as several microns or less, the recent increase in share is directed to the dry etching process which resorts to the use of either an ion beam or the ions or active atoms (or compounds) in plasma. As compared with the former method using the ion beam, the latter method using the ions or the like in the plasma, e.g., the RF (Radio Frequency) sputter etching method or the microwave plasma etching method has a higher ion density so that it is featured by a higher etching rate. Therefore, there have been made a variety of investigations, among which a method for generating the plasma with the use of microwave discharge is found especially excellent because: (1) since the discharge can be broken down even under a low pressure (which is lower than $1 \times 10^{-3}$ Torr), the direction of the ions is uniform; (2) it is possible to generate the plasma of especially high density; and (3) since the discharge is broken down without any electrode, the sample can be prevented from having its surface contaminated, and active gases can be used (e.g., U.S. Pat. No. 4,101,411).

However, the microwave plasma etching process has a fault that its etching rate is lower than that of the RF sputter etching process which has been frequently used according to the prior art. This is because the sample in the microwave plasma etching apparatus at the initial stage is held under a floating potential (about $-20$ volts) with respect to the plasma.

In order to eliminate this fault, therefore, there has been made a proposal, in which a higher negative potential than that floating potential is impressed upon the sample. More specifically, if the sample is supplied with a negative voltage from the outside, the ions are accelerated to impinge upon the sample surface so that the etching rate is increased.

As a result, in case the sample is made of a conductor, the etching rate can be increased by the method described in the above. Here, the sample to be etched in a semiconductor process has its surface made of an insulator such as a film of $SiO_2$ or a photo-resist. Consequently, the insulating surface is charged up by the ions. As a result, the negative voltage impressed upon the sample from the output is offset to apply no voltage to the sample so that the etching rate cannot be finally increased.

SUMMARY OF THE INVENTION

It is therefore, an object of the present invention to provide a dry etching apparatus which can etch a sample, even if its surface is made of an insulator, with the use of microwave plasma without any reduction in the etching rate.

In order to attain the above object, the microwave plasma etching apparatus according to the present invention is characterized in that there is provided means for impressing an AC voltage upon the sample and in that the frequency of that AC voltage is set to range from 100 KHz to 10 MHz.

According to the constructional characteristics of the present invention, the etching process can be carried out without any reduction in its rate even if the sample is made of an insulator or has its surface covered with an insulator.

Incidentally, the reasons for limiting the frequency range are as follows: If the frequency of the AC voltage impressed becomes lower than the lower limit of 100 KHz, the charge-up preventing effect of the insulating sample almost disappears; and If the frequency exceeds the upper limit of 10 MHz, an impedance matching circuit is required, when the AC voltage is introduced into the etching apparatus, so that the construction of the apparatus becomes complex.

In other words, the charge-up preventing mechanism according to the present invention can be analyzed in the following. During one half cycle in which the negative voltage of the high frequency AC voltage is impressed upon the insulating sample, the ions from the plasma impinge upon the sample surface thereby to effect the etching treatment. Since, however, the sample is made of an insulator, the coming ions other than those which are coupled and neutralized with the electrons having already impinged will effect the charge-up in the sample surface. During the next half cycle of the high frequency AC voltage, i.e., the half cylce in which the positive voltage is impressed upon the insulating sample, the ions from the plasma impinge upon the sample surface so that they are coupled and neutralized with the ions which have been charged up in the sample surface. During this neutralization, the etching treatment is not accomplished. During the subsequent half cycle, since the insulating sample is supplied with the negative voltage, the ions from the plasma enter the sample surface thereby to effect the etching treatment. Similar phenomena are repeated on and on. Specifically, the etching and neutralizing actions are alternately effected so that the charge-up during the etching treatment can be eliminated by the subsequent neutralizing treatment. On the other hand, for a low frequency, the charge-up preventing effect is not attained for the following reason. That is to say, the insulating sample can be thought to constitute a kind of condenser having a preset capacity. As a result, for the low frequency, the sample has such a high impedance as to make it hard for the AC current to flow. As a result, it becomes almost impossible to attain the charge-up preventing effect. For a high frequency higher a preset level, on the contrary, the impedance is so reduced as to make it feasible for the AC current to flow so that the charge-up preventing effect can be attained.

DESCRIPTION OF THE PREFERRED EMBODIMENTS

Figure 1:
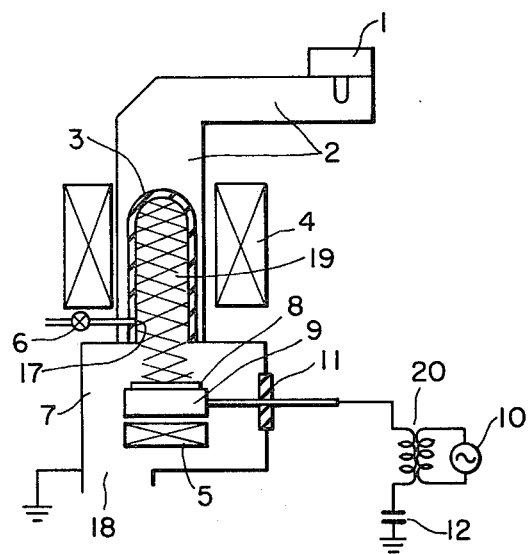
FIG. 1 is a diagrammatical view showing the construction of a dry etching apparatus according to the present invention.

FIG. 1 shows the diagrammatical construction of a microwave plasma etching apparatus according to the present invention. As shown, the microwaves (of 2.45 GHz), which are generated by a microwave generator (e.g., a magnetron) 1, are guided through a waveguide 2 until they are absorbed by the etching gases (which are introduced through a leak valve 6), which are controlled to a pressure lower than 1 atm. and which are reserved in such a discharge room 3 as is made of an insulator and as is placed in mirror magnetic fields established by mirror magnetic field making coils 4 and a permanent magnet 5. An etching room 7 has its inside composed of a gas inlet 17, an evacuating outlet 18 and a substrate stage 9 made of a conductor. Here, the area of the discharge room 3 and the etching room 7 forms a vacuum volume. The active ions in plasma 19 thus generated move along the mirror magnetic fields to impinge a sample 8 so that they etch the surface of the sample 8. At this time, the sample 8 and the substrate stage 9 are supplied with a high frequency AC voltage, as shown in FIG. 1. The voltage impressing means will be described in the following. A high frequency electric power supply 10 is connected with the primary coil of a transformer 20 which has no core and which has a ratio of about unit between the input and output voltages. The transformer 20 has its secondary coil connected at its one terminal with the substrate stage 9 and at its other with a condenser 12. This condenser 12 has its other terminal grounded to the earth. Here, the position of the condenser 12 may be located at the side of the substrate stage 9. On the other hand, an insulator 11 is mounted in the wall of the etching room 7 thereby to electrically float the substrate stage 9. Since the substrate 9 is made of an electric conductor, the high frequency voltage impressed thereupon is simultaneously applied to the sample 8. In short, the closed circuit at the secondary side of the transformer 20 is composed of the earth—the wall of the etching room 7—the plasma 19—the sample 8—the substrate stage 9—the secondary coil—the condenser 12—the earth. The condenser 12 is made to have a capacity of about 0.1 $\mu$F and to act to isolate the sample 8 from the earth in a direct current manner while allowing only a high frequency current to flow. By the use of the condenser 12, it is possible to restrict the electron current which flows as a direct current from the plasma 19 into the surface of the sample 8. As a result, it is possible to restrict the unnecessary temperature rise of the sample 8. The transformer 20 employs a coreless transformer, which may be replaced by a transformer using a core material if this material has good high frequency characteristics and large permeability.

Figure 2:
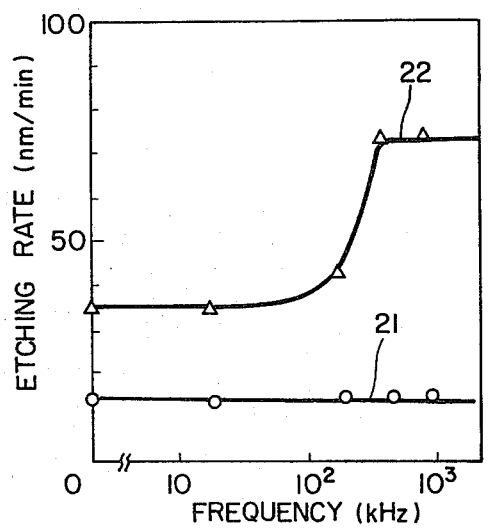
FIGS. 2 and 3 are graphical presentations illustrating the effects of the dry etching apparatus according to the present invention.

The effects of the present invention will be described in the following. FIG. 2 illustrates the changes coming from the kinds of the sample 8 by taking the frequency of the AC voltage to be impressed upon the sample 8 in an abscissa and by taking the etching rate at that time in an ordinate. According to the measuring conditions in this instance: $C_2F_6$+He (10%) is used as the etching gases; (1) a substrate of Si and (2) a substrate of Si having a surface of $SiO_2$ having a thickness of 1.6 $\mu$m are prepared as the sample 8; and a voltage of 120 V is used as the amplitude of the AC voltage to be impressed. A curve 21 corresponds to the case, in which the sample 8 is made of a substrate (1), i.e., Si. Si is a semiconductor so that no charge-up phenomenon takes place. Consequently, the etching rate can be substantially constant irrespective of the frequency of the voltage impressed. On the contrary, a curve 22 corresponds to the case, in which the sample 8 is made of a substrate (2), i.e., Si having a surface of $SiO_2$. As is apparent from this curve, when the frequency of the voltage impressed is gradually increased from 0 (i.e., the condition under which a negative voltage is impressed upon the sample (2)) until the frequency becomes higher than 100 KHz, the etching rate is also gradually increased until it is saturated in the vicinity of about 1 MHz. This can be explained by that the charge-up phenomana are gradually decreased, when the frequency becomes higher than 100 KHz, until they completely disappear at the frequency of about 1 MHz. As is apparent from the curve 22, more specifically, the etching rate can be substantially doubled in case the AC voltage of 1 MHz is impressed, as is different from the conventional case in which no AC voltage is impressed upon the sample (2) (i.e., the condition under which a direct negative voltage is impressed upon the sample (2)).

The difference in the etching rate between the Si indicated by the curve 21 and the $SiO_2$ indicated by the curve 22 results from that in the material. These different etching rates are varied with the kind and pressure of the etching gases, but the tendency of the voltage to be impressed for preventing the charge-up against the frequency is absolutely the same.

Figure 3:
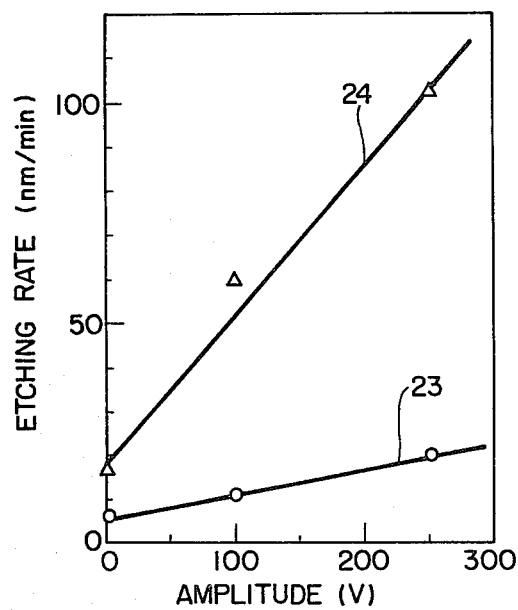

Turning to FIG. 3, the etching rate is plotted against the amplitude of the AC voltage to be impressed so that the changes coming from the kinds of the sample 8 may be illustrated. According to the measuring conditions in this instance, however, $C_2F_6$ gases are used as the etching gases, and the frequency of the impression voltage is set at 800 KHz, but the sample is the same as that which has been used in the example explained with reference to FIG. 2.

The influences from the amplitude of the impression voltage are such that the etching rate is increased with the increase in the amplitude, as shown in FIG. 3. This tendency is common between the case (for a curve 23), in which the sample is made of Si, and the case (for a curve 24), in which the sample is made of $SiO_2$, and is expressed by a substantially linear increase while leaving a difference in the gradient between the two curves. As is apparent from FIG. 3, in the case of the sampe of $SiO_2$ (or the curve 24), the etching rate for the case, in which the amplitude of the impression voltage is 150 V, becomes four times of that for the case of the zero impression voltage (i.e., for the conventional case, in which no AC voltage is impressed upon the sample).

Figure 4:
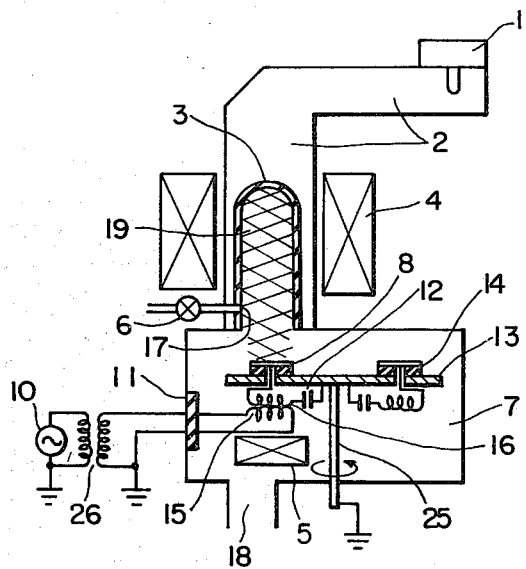
FIG. 4 is also a diagrammatical view showing the construction of another embodiment of the present invention.

Another embodiment of the present invention will now be described in the following. FIG. 4 shows the diagrammatical construction of the dry etching apparatus according to the second embodiment. The differences from the apparatus shown in FIG. 1 reside in the two points: that a rotating stage 13 is mounted in the etching room 7; and that the means for impressing the AC voltage upon the sample 8 placed upon the rotating stage 13 is made different. Therefore, only these differences will be described in detail while others being omitted. In order to prevent the temperature rise in the sample 8 and to etch a number of the samples 8 at a time, it is known effective to turn the sample 8. As concrete means for those purposes, the sample 8 is placed through a substrate stage 14 made of an insulator upon the rotating stage 13 which is fixed to a shaft of rotation 25. The means for impressing the AC voltage upon the sample 8 on such rotating stage 13 will be described in the following. First of all, a rotary coil 16, which is fixed to the rotating stage 13, is connected in series with the condenser 12. The rotary coil 16 has its other terminal contacting with the sample 8, whereas the condenser 12 has its other terminal connected with the rotating stage 13. And, this stage 13 itself is grounded to the earth. There is no fear of the sample 8 and the rotating stage 13 being short-circuited because they are isolated by the substrate stage 14 which is made of an insulator. Here, the connection between the sample 8 and the other terminal of the rotary coil 16 may be made in the following manner. Namely, the substrate stage 14 made of the insulator is formed at the side of the sample 8 with a conducting layer, with which is connected the other terminal of the rotary coil 16. Thus, the desired electric connection can be attained more reliably and simply.

A stationary coil 15, which is not rotated, is connected through another transformer 26 with the high frequency electric power supply 10. It is quite natural that the stationary coil 15 may be connected with the high frequency electric power supply directly not through the transformer 26. There is connected between the rotating stage 13 and the sample 8 placed thereon a series circuit which is composed of the rotary coil 16 and the condenser 12. Incidentally, the condenser 12 need not be used for each of the rotary coils 16 but can be commonly connected therewith. With these construction arrangements, at the instant when the rotating stage 13 is turned so that the rotary coil 16 placed on the rotating stage 13 reaches a position above the stationary coil 15, an inductive coupling takes place between the stationary coil 15 and the rotary coil 16 so that the high frequency voltage induced in the rotary coil 16 is impressed upon the sample 8. Since the rotating srage 13 is rotating with a constant speed, the coupling between the stationary coil 15 and the rotary coil 16 is promptly weakened. Since, at this time, the sample 8 has already been dislocated from the etching region by the plasma 19, no charge-up phenomenon takes place in the surface. Thus, the respective samples 8 never fail to be supplied with the AC voltage unless they are subjected to the etching treatments by the plasma 19 so that they are brought into the same condition as that of the apparatus shown in FIG. 1.

Here, in case the permanent magnet 5 is made of a conductor, an eddy current is established in the permanent magnet 5 by the high frequency waves if the stationary coil 15 is placed just above the permanent magnet 5. In this instance, similar effects can be obtained by placing the stationary coil 15 at a position, which is spaced by a preset angle of rotation from the permanent magnet 5, so that the rotary coil 16 may come to a position above the aforementioned stationary coil 15 when the sample 8 connected therewith just enters the plasma 19.

On the other hand, since the amplitude of the aforementioned high frequency voltage, i.e., 100 to 150 V is remarkably low in comparison with that of the voltage, which is to be impressed upon the sample by the conventional RF sputter etching apparatus, i.e., several KV, the damage which is to be exerted upon the sample during the etching treatment can be wholly neglected. Moreover, by suitably selecting the amplitude of the high frequency voltage and the pressure of the etching gases, not only the etching rate but also the sectional shape of the sample during the etching process can be controlled.

Still moreover, the waveform of the AC voltage to be impressed may be either positive or negative pulses of sine or square shape. In short, it is sufficient that positive and negative voltages can be alternately applied to the sample. Incidentally, the experiments conducted by applying the pulses have revealed that the higher etching rate can be attained by making the duration time of the positive voltage longer than that of the negative voltage. This is thought to come from the fact that the ratio of the etching period in one cycle can be enlarged by making the during time of the negative voltage than that of the positive voltage so that the etching rate can be improved.

According to the dry etching apparatus of the present invention thus far described, the sample can be etched without any reduction in the etching rate no matter which it is made of an insulator or a conductor covered with an insulator. As a result, the etching time is shortened while reducing the production cost.

We claim:

1. A dry etching apparatus comprising: a vacuum volume formed with a gas inlet for introducing discharge gases and with a discharge room; magnetic field generating means for generating a magnetic field in said discharge room; microwave generating means for generating a microwave electric field in said discharge room; sample holding means for holding a sample to be worked in said vacuum room such that it is isolated from the earth; and AC voltage impressing means for impressing such an AC voltage upon said sample which has a frequency ranging from 100 KHz to 10 MHz.

2. A dry etching apparatus as set forth in claim 1, wherein said AC voltage has a sine waveform 3. A dry etching apparatus as set forth in claim 1, wherein said AC voltage impressing means includes a series circuit having a transformer and a condenser, which are connected between said sample holding means and the earth, and wherein an AC electric power source is connected with the primary coil of said transformer.

4. A dry etching apparatus as set forth in claim 1, wherein said sample holding means is made rotatable within said vacuum volume, and wherein said AC voltage impressing means includes a series circuit composed of a rotary coil and a condenser, which are connected between said sample holding means and the earth, and a stationary coil arranged such that it can be inductively coupled with said rotary coil and connected with an AC electric power supply.

* * * * *